United States Patent
Kang et al.

(10) Patent No.: US 9,165,652 B2
(45) Date of Patent: Oct. 20, 2015

(54) SPLIT-GATE MEMORY CELLS HAVING SELECT-GATE SIDEWALL METAL SILICIDE REGIONS AND RELATED MANUFACTURING METHODS

(75) Inventors: Sung-Taeg Kang, Austin, TX (US); Cheong M. Hong, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 568 days.

(21) Appl. No.: 13/589,249

(22) Filed: Aug. 20, 2012

(65) Prior Publication Data

US 2014/0050029 A1 Feb. 20, 2014

(51) Int. Cl.
  *H01L 29/792* (2006.01)
  *H01L 29/423* (2006.01)
  *G11C 16/04* (2006.01)
  *H01L 21/28* (2006.01)
  *H01L 29/788* (2006.01)

(52) U.S. Cl.
  CPC ...... *G11C 16/0425* (2013.01); *H01L 21/28273* (2013.01); *H01L 29/42328* (2013.01); *H01L 29/42332* (2013.01); *H01L 29/7881* (2013.01)

(58) Field of Classification Search
  CPC ............... H01L 29/42328; H01L 29/42344; H01L 29/788; H01L 29/792; H01L 21/28282
  See application file for complete search history.

(56) References Cited

U.S. PATENT DOCUMENTS

| | | | |
|---|---|---|---|
| 5,342,798 A | 8/1994 | Huang | |
| 6,646,326 B1 * | 11/2003 | Kim et al. | 257/623 |
| 7,045,848 B2 * | 5/2006 | Shukuri | 257/311 |
| 7,250,655 B2 | 7/2007 | Bae et al. | |
| 7,416,945 B1 * | 8/2008 | Muralidhar et al. | 438/267 |
| 7,579,243 B2 * | 8/2009 | Kang et al. | 438/267 |
| 7,700,439 B2 * | 4/2010 | Prinz et al. | 438/267 |
| 7,767,522 B2 * | 8/2010 | Toba et al. | 438/257 |
| 7,821,055 B2 * | 10/2010 | Loiko et al. | 257/316 |
| 7,985,649 B1 | 7/2011 | Winstead et al. | |
| 2009/0026549 A1 | 1/2009 | Teh et al. | |
| 2009/0256186 A1 * | 10/2009 | Kang et al. | 257/314 |

* cited by examiner

*Primary Examiner* — Allison P Bernstein
(74) *Attorney, Agent, or Firm* — Egan, Peterman & Enders LLP.

(57) ABSTRACT

Split-gate non-volatile memory (NVM) cells having select-gate sidewall metal silicide regions are disclosed along with related manufacturing methods. Spacer etch processing steps are used to expose sidewall portions of select gates. Metal silicide regions are then formed within these sidewall portions of the select gates. Further, metal silicide regions can also be formed in top portions of the select gates. Further, the select gates can also be formed with one or more notches. By expanding the size of the metal silicide region to include the sidewall portion of the select gate, the select gate wordline (e.g., polysilicon) resistance is reduced for split-gate NVM arrays, the electrical contact to the select gate is improved, and performance of the select-gate NVN cell is improved.

21 Claims, 5 Drawing Sheets

SPLIT-GATE MEMORY CELLS HAVING SELECT-GATE SIDEWALL METAL SILICIDE REGIONS AND RELATED MANUFACTURING METHODS

TECHNICAL FIELD

This technical field relates to non-volatile memories (NVMs) and, more particularly, to split-gate NVM cells and methods for manufacturing split-gate NVM cells.

BACKGROUND

Prior programmable memories have been implemented using split-gate non-volatile memory (NVM) cells. These programmable memories can be implemented as stand-alone memory integrated circuits or can be embedded within other integrated circuits, as desired.

FIG. 1 (Prior Art) is an embodiment 100 for a split-gate memory cell having metal silicide regions. A control gate (CG) 112 and a select gate (SG) 110 are formed over a substrate 102. A source region 108 and a drain region 104 are formed within substrate 102. An oxide dielectric layer 130 is formed above substrate 102 below the select gate (SG) 110. The charge storage layer 132 is positioned below the control gate (CG) 112 and is positioned between the control gate (CG) 112 and the select gate (SG) 110. The charge storage layer 132 can be a discrete charge storage layer, if desired, such as a nanocrystal discrete charge storage layer. The charge storage layer can also be a continuous charge storage layer, if desired, such as a polysilicon floating gate charge storage layer. An anti-reflective dielectric layer 128 is positioned above the select gate (SG) 110 and below the charge storage layer 132. Spacers 114, 116 and 118 are also depicted. These spacers can be implemented as nitride spacers, a combination of nitride and oxide spacers, or as spacers from other material, as desired. Spacer 114 is located adjacent the select gate (SG) 110. Spacer 116 is located above the select gate (SG) 110 and adjacent the control gate (CG) 112. And spacer 118 is located adjacent the control gate (CG) 112. Regions 120, 122, 124, and 126 are metal silicide regions that are formed within drain region 104, select gate (SG) 110, control gate (CG) 112, and source region 108, respectively.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale FIG. 1 (Prior Art) is a diagram for a previous split-gate non-volatile memory (NVM) cell.

DETAILED DESCRIPTION

Split-gate non-volatile memory (NVM) cells having select-gate sidewall metal silicide regions are disclosed along with related manufacturing methods. Spacer etch processing steps are used to expose sidewall portions of select gates. Metal silicide regions are then formed within these sidewall portions of the select gates. Further, metal silicide regions can also be formed in top portions of the select gates. Further, the select gates can also be formed with one or more notches. By expanding the size of the metal silicide region to include the sidewall portion of the select gate, the select gate wordline (e.g., polysilicon) resistance is reduced for split-gate NVM arrays, the electrical contact to the select gate is improved, and performance of the select-gate NVN cell is improved. Variations can be implemented, as desired, and related and/or modified systems and methods can be utilized, as well.

Figure 7:
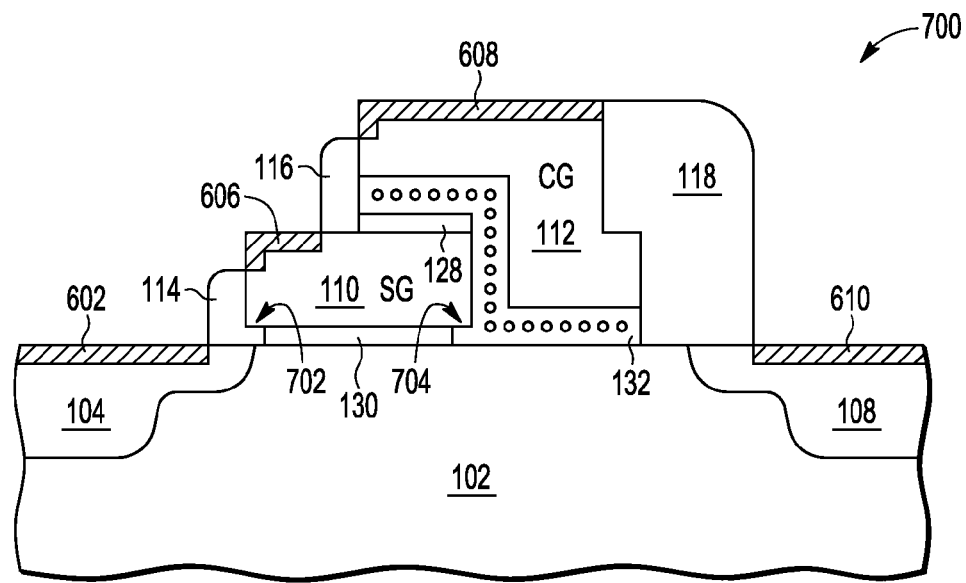
FIG. 7 is a diagram for the split-gate stack having a select gate with one or more notches formed in its bottom surface.
Figure 8:
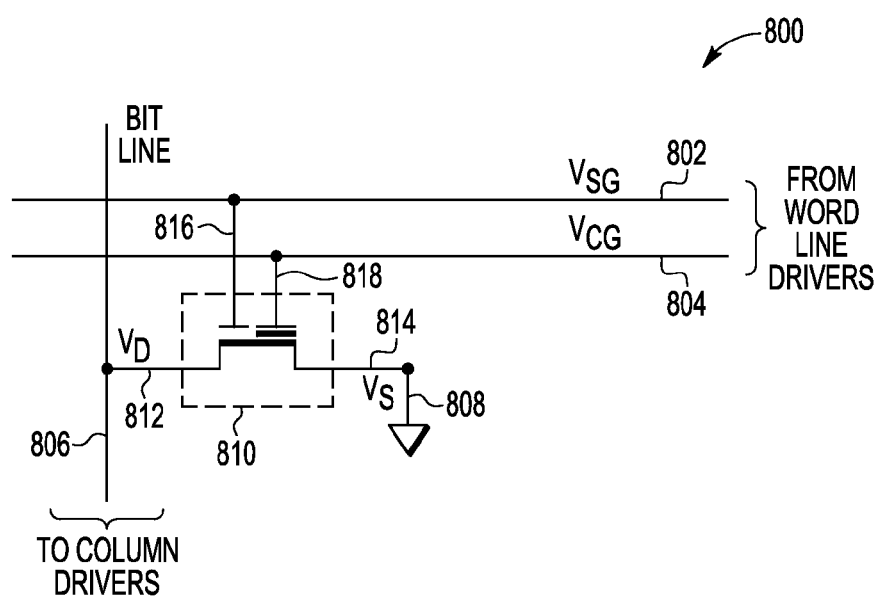
FIG. 8 is a diagram of an embodiment for connections to a split-gate NVM cell.
Figure 9:
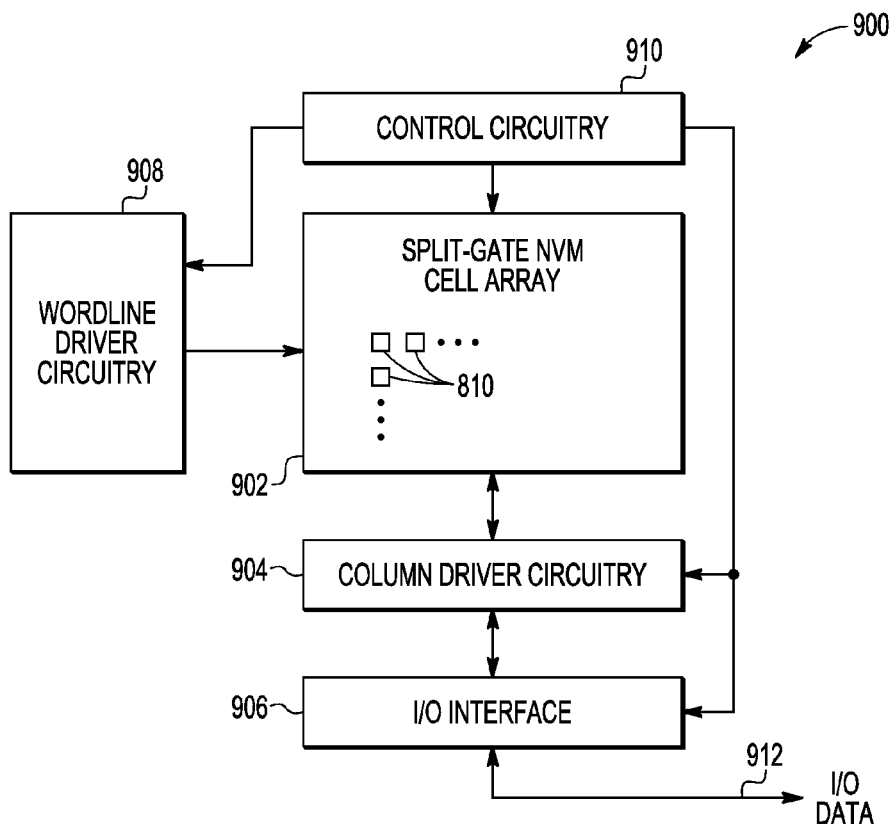
FIG. 9 is a block diagram of an embodiment for a split-gate NVM system including an array of split-gate NVM cells.
Figure 10:
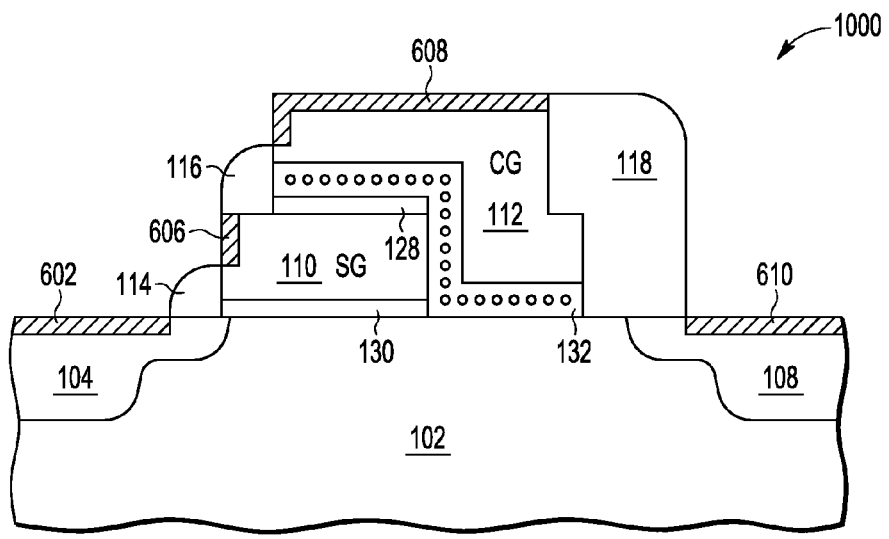
FIG. 10 is a diagram for the split-gate stack having a select gate with only sidewall metal silicide regions.

FIGS. 2-6 provide process steps for forming metal silicide regions for a split-gate NVM memory cell, including metal silicide regions within sidewall portions of select gates. FIGS. 7 and 10 provide further embodiments. FIGS. 8-9 provide memory system embodiments that utilize the split-gate NVM memory cells described herein. The embodiments described herein advantageously reduce select-gate wordline resistance for split-gate NVM memory arrays and enable high speed switching by reducing the select-gate wordline resistance, thereby improving process controllability and overcoming scaling limits for select-gate length in thin film storage (TFS) split-gate NVM systems.

It is initially noted that metal silicide regions are often used in integrated circuits to reduce gate polysilicon resistances and to improve electrical contacts to semiconductor structures within the integrated circuits. For example, with respect to split-gate NVM cells, metal silicide regions can be created by forming metal silicide within the exposed surfaces of the drain region, the source region, the control gate, and the select gate. Metal silicide can be formed within these regions, for example, by first forming a thin metal film over regions where metal silicide regions are desired. The thin metal film is then reacted with these regions through a series of annealing processes to form metal silicide regions. When heated, the thin metal film will react with exposed silicon within the interested regions to form a low-resistance metal silicide. This low-resistance metal silicide can be used to reduce resistance for electrical contacts and to reduce resistance for signal paths, such as polysilicon signal paths. Once the desired metal silicide regions are formed, the remaining metal film can then be removed by one or more etching processes. The formation of the metal silicide regions can also be a self-aligned process that uses already formed structures to align the formation of the metal silicide regions. Such self-aligned metal silicide regions are often called salicide, and the process of forming salicide regions is often called salicidation. A variety of metals can be used to form the metal silicide regions, including the following transition metals: titanium, cobalt, nickel, platinum or tungsten. Other metals could also be used, and different processing steps could also be used to form the metal silicide regions, as desired.

Figure 1:
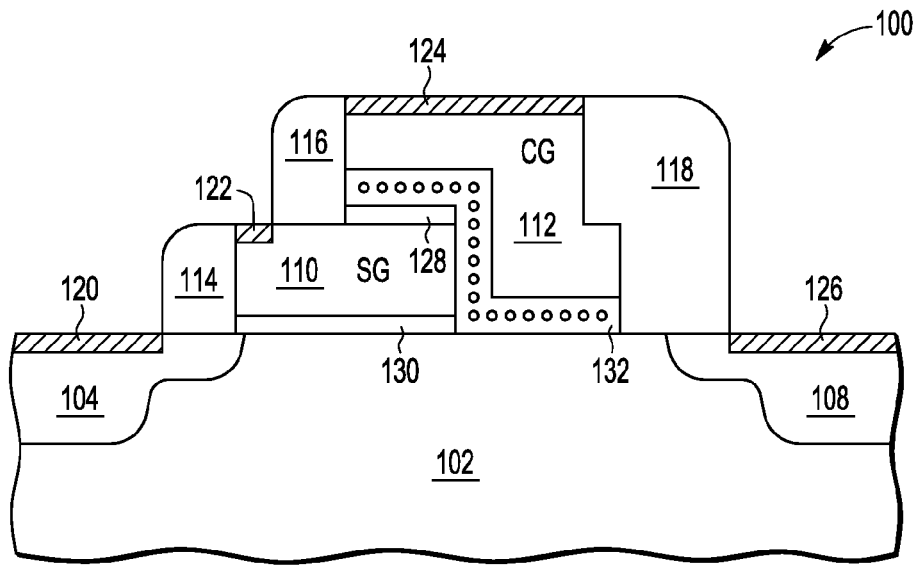
Figure 2:
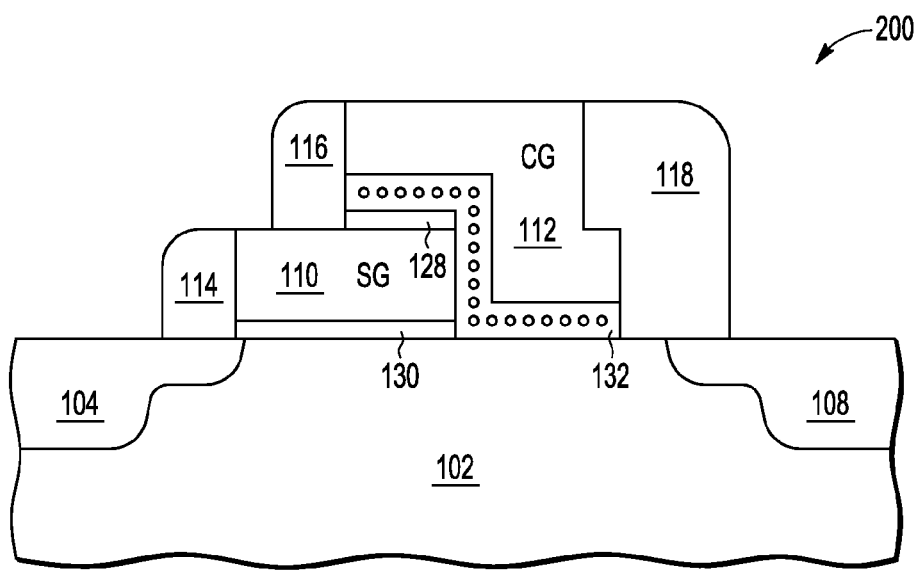
FIG. 2 is a diagram of a split-gate stack for a split-gate NVM cell prior to forming metal silicide regions.

FIG. 2 is an embodiment 200 for a split-gate NVM cell stack prior to formation of metal silicide regions. As depicted, a control gate (CG) 112 and a select gate (SG) 110 are formed over a substrate 102. A source region 108 and a drain region 104 are formed within substrate 102. A dielectric layer 130 (e.g., oxide or other dielectric material) is positioned above substrate 102 below the select gate (SG) 110. A charge storage layer 132 is positioned below the control gate (CG) 112 and is positioned between the control gate (CG) 112 and the select gate (SG) 110. The charge storage layer 132 can be a discrete charge storage layer, if desired, such as a dielectric layer having embedded silicon or silicon germanium nanocrystals and/or metal nanoclusters. The charge storage layer can also be a continuous charge storage layer, if desired, such as a polysilicon floating gate charge storage layer or oxide-nitride-oxide layer. Other charge storage layers could also be used for charge layer 132, if desired. An anti-reflective dielectric layer 128 is positioned above the select gate (SG) 110 and below the charge storage layer 132. Spacers 114, 116 and 118 are also depicted. These spacers can be implemented as nitride spacers, a combination of nitride and oxide spacers, or as spacers from other material, as desired. Spacer 114 is located adjacent the select gate (SG) 110. Spacer 116 is located above the select gate (SG) 110 and adjacent the control gate (CG) 112. And spacer 118 is located adjacent the control gate (CG) 112. In contrast with FIG. 1 (Prior Art), metal silicide regions have not yet been formed.

It is noted that the drain region 104 and source region 108 can be formed using one or more deposition and/or implant process steps, as desired. Further, additional and/or different process steps could also be used to form drain region 104 and source region 108, as desired. Still further, the drain region 104 and the source region 108 can be formed after the etch step depicted in FIG. 4, if desired. It is further noted that the control gate can be implemented as polysilicon, if desired.

Figure 3:
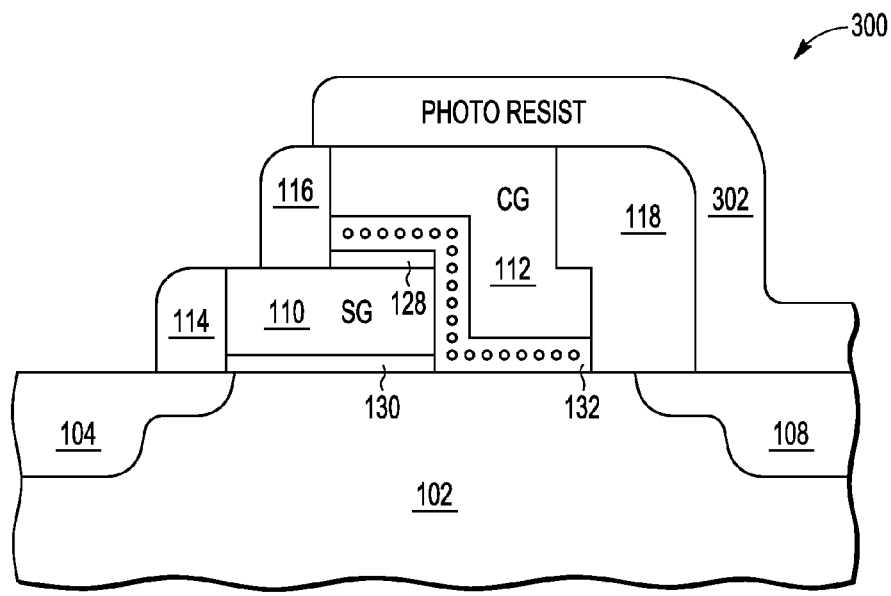
FIG. 3 is a diagram for the split-gate stack of FIG. 2 after formation of a photoresist layer.

FIG. 3 is an embodiment 300 where deposition and patterning of a photoresist layer 302 has occurred. As depicted, a photoresist layer 302 has been formed above the control gate (CG) 112 and source region 108. This photoresist layer 302 has been patterned such that spacer 118, control gate (CG) 112, and source region 108 is covered. However, only a portion of spacer 116 is covered by the photoresist layer 302, and spacer 114 is not covered by the photoresist layer 302. This photoresist deposition/patterning processing step is used to prepare for the spacer etch processing step that follows.

Figure 4:
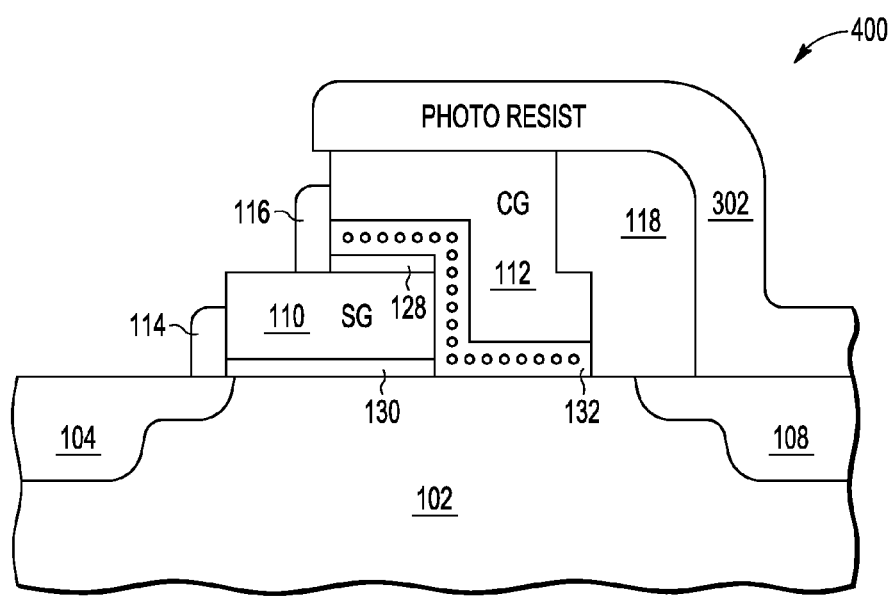
FIG. 4 is a diagram for the split-gate stack of FIG. 3 after an etching process step.

FIG. 4 is an embodiment 400 where a spacer etch processing step has occurred. As depicted, the spacer 114 and the spacer 116 have been etched both vertically and horizontally. An isotropic etch step can be utilized for this etch, and this isotropic etch process step can be conducted as a single-step etch process, if desired. Multiple isotropic and/or non-isotropic etch steps could also be utilized, if desired. It is again noted that the spacers 114, 116 and 118 can be nitride spacers, a combination of nitride and oxide spacers, or as spacers from other material, as desired. If nitride spacers are used, the etch processing step can be a nitride etch processing step, such as a single-step isotropic nitride etch that etches spacers 114 and 116 in a single-step etch. It is further noted that nitride spacers can be etched, for example, using a phosphoric acid solution and/or other desired nitride etchants, and that oxide spacers can be etched using hydrofluoric acid (HF), buffered HF, and/or other desired oxide etchants.

Figure 5:
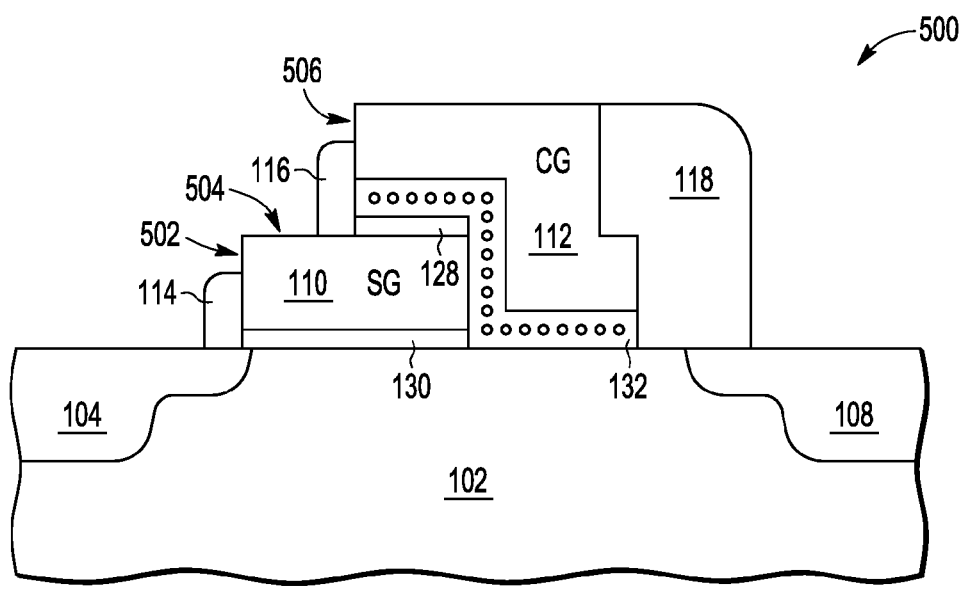
FIG. 5 is a diagram for the split-gate stack of FIG. 4 after removal of the photoresist layer.

FIG. 5 is an embodiment 500 where the photoresist layer 302 has been removed. The photoresist layer 302 can be removed using a photoresist etch process step. As seen in FIG. 5, contact regions are now exposed in preparation for formation of metal silicide regions. Advantageously, in contrast with FIG. 1 (Prior Art), for the embodiments described herein, both a sidewall portion 502 of select gate (SG) 110 and a top portion 504 of select gate (SG) 110 are exposed for formation of metal silicide regions. Further, a sidewall portion 506 of the control gate (CG) 112 has also been exposed.

Figure 6:
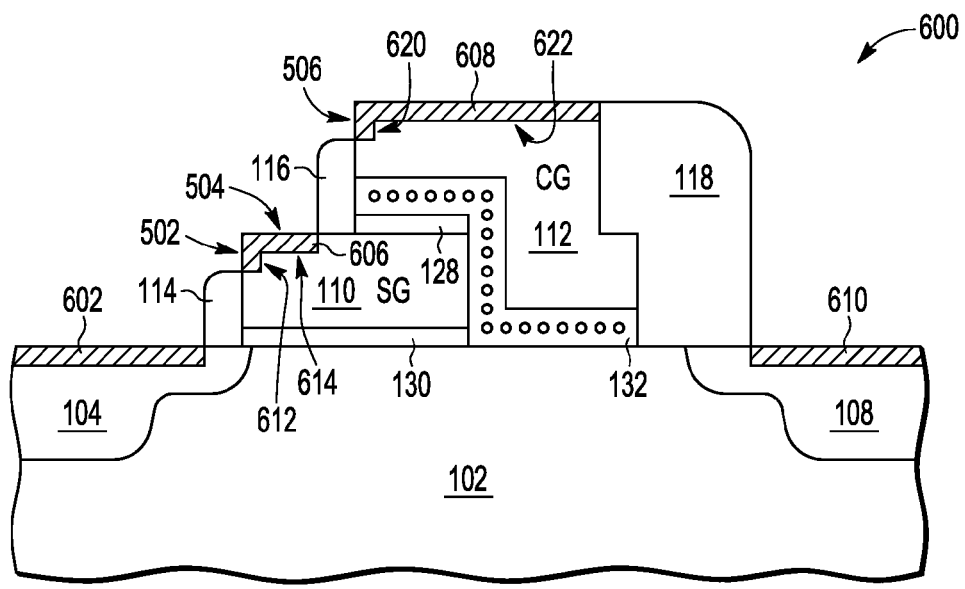
FIG. 6 is a diagram for the split-gate stack of FIG. 5 after formation of metal silicide regions including a metal silicide region within the sidewall portion of the select gate.

FIG. 6. is an embodiment 600 where metal silicide regions have been formed. For example, similar to FIG. 1 (Prior Art), a metal silicide region 602 has been formed within the drain region 104, and a metal silicide region 610 has been formed in source region 108. In contrast with FIG. 1 (Prior Art), however, a metal silicide region 606 has been formed in the select gate (SG) 110 that provides a larger metal silicide surface area. In particular, the metal silicide region 606 is formed within the exposed sidewall portion 502 of the select gate (SG) 110 as well as within the exposed top portion 504 of select gate (SG) 110. Thus, by exposing the sidewall portion 502 of the select gate (SG) 110 and forming a metal silicide region within this sidewall portion 502, the metal silicide region for the select-gate is increased in size, thereby reducing electrical resistance of the select gate (SG) 110, as compared to prior solutions. Further, the size of the exposed top portion of select gate (SG) 110 is also increased, as compared to prior solutions, thereby further increasing the metal silicide region for the select gate (SG) 110. In addition, in further contrast with FIG. 1 (Prior Art), a metal silicide region 608 has been formed in the control gate (CG) 112 that also provides a larger metal silicide surface area. In particular, the metal silicide region 608 is formed within the exposed sidewall portion 506 of the control gate (CG) 112 as well as within the exposed top portion of control gate (CG) 112.

It is noted that as compared metal silicide region 122 in FIG. 1 (Prior Art), the metal silicide region 606 includes a vertical metal silicide region 612 within the sidewall portion 502 that extends below the horizontal metal silicide region 614 formed within the top portion 504. The vertical region 612 overlaps with the horizontal region 614 at the corner of the select gate (SG) 110. It is noted that the vertical region 612 can be implemented to extend below the depth of the horizontal region 614 by any desired amount, and the vertical height of the vertical region 612 will depend upon the amount of exposed surface for the sidewall portion 502. It is also noted that the metal silicide region 608 within the control gate (CG) 112 also includes a vertical metal silicide region 620 that extends below the depth of a horizontal metal silicide region 622. The vertical height of this vertical region 620 can also be implemented as desired and will depend upon the amount of exposed surface for the sidewall of the control gate (CG) 112.

For certain embodiments, it is noted that the depth for the metal silicide regions from top and/or sidewall surfaces can be between 50 to 100 Angstroms. It is further noted that the vertical region 612 can be implemented, if desired, to extend 30% or more of the vertical height of the select gate (SG) 110. Thus, if the vertical height of the select gate (SG) 110 is between 500 to 1500 Angstroms, the vertical region 612 would extend 150 to 450 Angstroms or more below the top surface of the top portion 504 of the select gate (SG) 110. More generally, it is desirable for the vertical region 612 to extend 50 Angstroms or more below the bottom surface of the horizontal region 614. And the larger the vertical region 612 is within the select gate (SG) 110, the more the select gate wordline (e.g., polysilicon) resistance is reduced. It is further noted, however, that if the vertical region 612 extends too close to the dielectric layer 130, performance may be degraded. In addition, if the vertical region 612 ends very close to the horizontal region 614, then the metal silicide sidewall region advantages described herein may not be achieved. Variations to the described embodiments could also be implemented, as desired, while still taking advantage of the select-gate sidewall metal silicide regions described herein.

FIG. 7 is an embodiment 700 that is similar to the embodiment 600 of FIG. 6, except that the select gate (SG) 110 include notches 702 and 704 at the edges of its bottom surface. These notches 702 and 704 can be formed during select gate formation processing steps, if desired. These notch portions 702 and 704 can improve cell performance and can be used or not used, as desired. In particular, the notch 702 adjacent the spacer 114 can provide additional distance between the select gate 110 and the drain region 104, thereby improving performance of the NVM cell.

FIG. 10 is an embodiment 1000 that is similar to the embodiment 600 of FIG. 6, except that the silicide region 606 is formed only within the sidewall portion 502 of the select gate (110) and not within the top portion 504 of the select gate (110). For the embodiment 1000 depicted, the control gate (CG) 112 extends further towards the edge of the top surface of select gate (SG) 110, as would likely occur of cell geometries are reduced. Further, the spacer 116 extends to the edge of the top surface of the select gate (SG) 110. As such, the silicide region 606 is formed only within the exposed sidewall portion of the select gate (SG) 110, as the top surface of the select gate (SG) 110 is not exposed. For this example embodiment, therefore, the silicide region 606 includes only a vertical metal silicide region. As described above, the metal silicide region 606 can be formed within the exposed vertical sidewall portion of the select gate (SG) 110 by first forming a thin metal film over this region and then by reacting this metal film with the underlying vertical sidewall portion of the select gate (SG) 110 through a series of annealing processes to form the metal silicide region.

For the embodiments described herein, it is noted that the semiconductor substrate 102 can be a P-type mono-crystalline silicon substrate, if desired. Further, the drain region 104 and the source region 108 can be doped N-type, if desired. The oxide dielectric layers 130 and 131 can each be silicon oxide layers, if desired, or some other dielectric material could be used for these layers as well. The select gate 110 and the control gate 112 can be conductive materials such as doped polysilicon. As indicated above, the charge storage layer 132 can be implemented as a discrete charge storage layer, if desired. For example, a discrete charge storage layer can be formed using silicon nanocrystals, metal nanoclusters, nitride or some other desired discrete charge storage layer material. Charge storage layer 132 can also be implemented as a continuous charge storage layer, such as a polysilicon charge storage layer. Further, the continuous charge storage layer can be a floating gate charge storage layer. Other charge storage layers could also be used, if desired. It is further noted that other variations could also be implemented, as desired.

Still further, it is noted that the semiconductor substrate 102 described herein can be any desired semiconductor material or combinations of materials, such as gallium arsenide, silicon germanium, silicon-on-insulator (SOI), silicon, monocrystalline silicon, other semiconductor materials, and combinations of these semiconductor materials. It is also noted that the semiconductor substrate 102 represents the top portion of a semiconductor substrate. It is further noted that the semiconductor substrate 102 for the split-gate NVM cells described herein could be formed on top of other substrate materials including a separate non-semiconductor material, if desired, such as thin film semiconductor substrates formed on other semiconductor or non-semiconductor materials. Other variations could also be implemented, as desired.

FIG. 8 is a diagram of an embodiment 800 for wordline driver and column driver connections associated with a split-gate NVM cell 810 having a select-gate sidewall metal silicide region, as described herein. For the embodiment depicted, a source voltage ($V_S$) 814 is provided by a connection to ground 808. A drain voltage ($V_D$) 812 is provided by a connection to the column bit-line 806, which is in turn coupled to column driver circuitry. A control gate voltage ($V_{CG}$) is provided by a connection to a first wordline 804, and the select-gate voltage ($V_{SG}$) is provided by a connection to a second wordline 802. The wordline 802 and wordline 804 are coupled to wordline driver circuitry.

FIG. 9 is a block diagram of an embodiment for a split-gate NVM system 900 including a memory cell array 902 having a plurality of split-gate NVM cells 810, each having a select-gate sidewall metal silicide region, as described herein. The split-gate NVM cell array 902 is coupled to wordline (WL) driver circuitry 908, which provides select-gate and control-gate wordline voltages to the split-gate NVM cells 810 within the memory cell array 902. The split-gate NVM cell array 902 is also coupled to column driver circuitry 904. For read and verify operations, the column driver circuitry 904 determines charge levels stored in selected NVM cells within the array 902 and outputs related data to an input/output (I/O) interface 906. For program and erase operations, the column driver circuitry 904 provides program/erase voltage levels to selected NVM cells within the array 902. Control circuitry 910 provides control signals to the wordline (WL) driver circuitry 908, the column driver circuitry 904, the NVM cell array 902, and the I/O interface 906. It is further noted that the array of split-gate NVM cells 902, the wordline driver circuitry 908, the column driver circuitry 904, the control circuitry 910, and/or the I/O interface 906 can be integrated within a single integrated circuit. It is further noted that the input/output (I/O) output data channel 912 coupled to the I/O interface 906 can be used internally within an integrated circuit or can be used to communicate data externally from the integrated circuit within which the split-gate NVM system 900 is integrated, as desired.

For operation of the split-gate NVM cell 810, charge is either added to or removed from the discrete charge storage layer 132, depending upon whether the cell is desired to be programmed or erased. For example, for some embodiments, when the NVM cell 810 is programmed, electrons can be added to the discrete charge storage layer 132. When the NVM cell 810 is erased, electrons can be removed. For a read operation of the split-gate NVM cell 400, a determination is then made as to whether or not there is a sufficient amount of charge stored within the charge storage layer 132 to qualify as a logic "1." If not, then it is deemed a logic "0." Other and/or different program/erase/read operations could also be performed depending upon the particular NVM system and NVM cells implemented. For example, it is further noted that multi-level charge storage layers can also be utilized for the charge storage layers 132 within the NVM cells 810, if desired. For multi-level charge storage layers, two or more bits of information are stored by each NVM cell 810 depending upon the level of charged stored within the charge storage layer 132. Other variations could also be implemented, as desired.

Advantageously, the NVM systems embodiments described herein utilize NVM cells that have metal silicide regions formed within sidewall portions of the select gate. As described herein, by expanding the size of the metal silicide region to include the sidewall portion of the select gate, the select gate wordline (e.g., polysilicon) resistance is reduced for split-gate NVM arrays, the electrical contact resistance to the select gate is reduced, and performance of the select-gate NVN cell is improved.

As described herein, a variety of embodiments can be implemented and different features and variations can be implemented, as desired.

In one embodiment, a method for forming a split-gate non-volatile memory (NVM) cell having a select-gate sidewall metal silicide region includes forming a split-gate stack including a select gate, a control gate, a charge storage layer, and a first spacer positioned adjacent the select gate. The method further includes etching the first spacer to expose a sidewall portion of the select gate and forming a metal silicide region within the exposed sidewall portion of the select gate. In a further embodiment, the split-gate stack includes a second spacer positioned adjacent the control gate, and the etching step includes etching the first spacer and the second spacer to expose a corner of the select gate, where the exposed corner includes a sidewall portion and a top portion of the select gate, and where the forming step includes forming a metal silicide region within the exposed corner of the select gate so that the metal silicide region includes a vertical portion and a horizontal portion. Still further, the vertical portion of the metal silicide region can be configured to extend at least 30 percent or more of a vertical height of the select gate. In further embodiments, the select-gate can include a notch located at its bottom surface adjacent the first spacer such that the first spacer extends underneath the select-gate. In addition, the forming a metal silicide step can include a self-aligned silicide process, and the etching step can include an isotropic etch. Still further, the charge storage layer can include at least one of a discrete charge storage layer or a continuous charge storage layer. The forming a metal silicide step can also form a metal silicide region within the top portion of the control gate. And the forming step can further include forming a metal silicide region within a sidewall portion of the control gate.

In another embodiment, a split-gate non-volatile memory (NVM) cell having a select-gate sidewall metal silicide region includes a select gate, a control gate, a charge storage layer positioned at least in part between the select gate and the control gate, a first spacer positioned adjacent the select gate, and a metal silicide region formed within a sidewall portion of the select-gate. In additional embodiments, the split-gate NVM cell can further include second spacer positioned adjacent the control gate, and a metal silicide region can also be formed within a top portion of the select-gate. Still further, the metal silicide region within the sidewall portion of the select-gate can be configured to extend at least 30 percent or more of a height of the select gate. In further embodiments, the select-gate includes a notch located at its bottom surface adjacent the first spacer such that the first spacer extends underneath the select-gate. The charge storage layer can include at least one of a discrete charge storage layer or a continuous charge storage layer. And the split-gate NVM cell can further include a metal silicide region formed in a top portion of the control gate and in a sidewall portion of the control gate.

In a further embodiment, a non-volatile memory (NVM) system having NVM cells with select-gate sidewall metal silicide regions includes an array of split-gate non-volatile memory (NVM) cells, wordline driver circuitry coupled to the plurality of split-gate NVM cells, and column driver circuitry coupled to the plurality of split-gate NVM cells where the array of split-gate NVM cells, the wordline driver circuitry, and the column driver circuitry are integrated within a single integrated circuit. Each of the split-gate NVM cells further includes a select gate, a control gate, a charge storage layer positioned at least in part between the select gate and the control gate, a first spacer positioned adjacent the select gate, and at least one metal silicide region formed within a sidewall portion of the select-gate. In further embodiments, each split-gate NVM cell further includes a second spacer positioned adjacent the control gate, and for each split-gate NVM cell, a metal silicide region is also formed within a top portion of the select-gate. Further, the metal silicide region within the sidewall portion of the select-gate can be configured to extend at least 30 percent or more of a height of the select gate. In still further embodiments, the select-gate for each split-gate NVM cell includes a notch located at its bottom surface adjacent the first spacer such that the first spacer extends underneath the select-gate. The charge storage layer for each split-gate NVM cell can include at least one of a discrete charge storage layer or a continuous charge storage layer. And each split-gate NVM cell can further include a metal silicide region formed within a top portion and a sidewall portion of the control gate.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A method for forming a split-gate non-volatile memory (NVM) cell having a select-gate sidewall metal silicide region, comprising:
    forming a split-gate stack including a select gate, a control gate, a charge storage layer, and a first spacer positioned adjacent the select gate;
    etching the first spacer to expose a sidewall portion of the select gate; and
    forming a metal silicide region within the exposed sidewall portion of the select gate;
    wherein the metal silicide region within the sidewall portion of the select gate extends at least 30 percent or more of a height of the select gate.

2. The method of claim 1, wherein the split-gate stack further includes a second spacer positioned adjacent the control gate, wherein the etching step further comprises etching the second spacer to expose a top portion of the select gate, and wherein the forming step further comprises forming a metal silicide region within the top portion of the select gate.

3. The method of claim 1, wherein the first spacer extends into a notch underneath the select gate.

4. The method of claim 1, wherein the forming a metal silicide step comprises a self-aligned silicide process.

5. The method of claim 1, the etching step comprises an isotropic etch.

6. The method of claim 1, wherein the charge storage layer comprises at least one of a discrete charge storage layer or a continuous charge storage layer.

7. The method of claim 1, wherein the forming a metal silicide step also forms a metal silicide region within the top portion of the control gate.

8. The method of claim 1, wherein the forming step further comprises forming a metal silicide region within a sidewall portion of the control gate.

9. The method of claim 1, wherein the split-gate stack further includes a second spacer positioned adjacent the control gate, wherein the forming step further comprises etching the second spacer without exposing a top portion of the select gate, and wherein the forming step comprises forming the metal silicide region within the exposed sidewall portion of the select gate without forming a metal silicide region in the top portion of the select gate.

10. A split-gate non-volatile memory (NVM) cell having a select-gate sidewall metal silicide region, comprising:
   a select gate;
   a control gate;
   a charge storage layer positioned at least in part between the select gate and the control gate;
   a first spacer positioned adjacent the select gate; and
   a metal silicide region formed within a sidewall portion of the select gate;
   wherein the metal silicide region within the sidewall portion of the select gate extends at least 30 percent or more of a height of the select gate.

11. The split-gate NVM cell of claim 10, further comprising a second spacer positioned adjacent the control gate, and wherein a metal silicide region is also formed within a top portion of the select gate.

12. The split-gate NVM cell of 10, wherein the first spacer extends into a notch underneath the select gate.

13. The split-gate NVM cell of claim 10, wherein the charge storage layer comprises at least one of a discrete charge storage layer or a continuous charge storage layer.

14. The split-gate NVM cell of claim 10, further comprising a metal silicide region formed in a top portion of the control gate and in a sidewall portion of the control gate.

15. The NVM cell of claim 10, further comprising a second spacer positioned adjacent the control gate and over a top portion of the select gate, and wherein a metal silicide region is not formed within the top portion of the select gate.

16. A non-volatile memory (NVM) system having NVM cells with select-gate sidewall metal silicide regions, comprising:
   an array of split-gate non-volatile memory (NVM) cells, each split-gate NVM cell comprising:
      a select gate;
      a control gate;
      a charge storage layer positioned at least in part between the select gate and the control gate;
      a first spacer positioned adjacent the select gate; and
      at least one metal silicide region formed within a sidewall portion of the select gate, the metal silicide region within the sidewall portion of the select gate extending at least 30 percent or more of a height of the select gate;
   wordline driver circuitry coupled to the plurality of split-gate NVM cells; and
   column driver circuitry coupled to the plurality of split-gate NVM cells;
   wherein the array of split-gate NVM cells, the wordline driver circuitry, and the column driver circuitry are integrated within a single integrated circuit.

17. The NVM system of claim 16, wherein each split-gate NVM cell further comprises a second spacer positioned adjacent the control gate, and wherein for each split-gate NVM cell, a metal silicide region is also formed within a top portion of the select gate.

18. The NVM system of claim 16, wherein for each split-gate NVM cell, the first spacer extends into a notch underneath the select gate.

19. The NVM system of claim 16, wherein for each split-gate NVM cell, the charge storage layer comprises at least one of a discrete charge storage layer or a continuous charge storage layer.

20. The NVM system of claim 16, wherein each split-gate NVM cell further comprises a metal silicide region formed within a top portion and a sidewall portion of the control gate.

21. The NVM system of claim 16, wherein each split-gate NVM cell further comprises a second spacer positioned adjacent the control gate and over a top portion of the select gate, and wherein for each split-gate NVM cell, a metal silicide region is not formed within the top portion of the select gate.

* * * * *